United States Patent
Choi et al.

(12) 
(10) Patent No.: US 6,469,933 B2
(45) Date of Patent: Oct. 22, 2002

(54) FLASH MEMORY DEVICE CAPABLE OF PREVENTING PROGRAM DISTURB AND METHOD FOR PROGRAMMING THE SAME

(75) Inventors: Sun-Mi Choi, Kyunggi-do (KR); Yeong-Taek Lee, Seoul (KR); Young-Ho Lim, Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/952,628

(22) Filed: Sep. 13, 2001

(65) Prior Publication Data

US 2002/0060926 A1 May 23, 2002

(30) Foreign Application Priority Data

Nov. 22, 2000 (KR) ........................................ 2000-69534

(51) Int. Cl.$^7$ .............................................. G11C 16/04
(52) U.S. Cl. ............................ 365/185.17; 365/185.18; 365/185.19
(58) Field of Search ....................... 365/185.17, 185.18, 365/185.19, 236

(56) References Cited

U.S. PATENT DOCUMENTS

| | | |
|---|---|---|
| 5,677,873 A | 10/1997 | Choi et al. |
| 5,715,194 A | 2/1998 | Hu |
| 5,991,202 A | 11/1999 | Derhacobian et al. |
| 6,061,270 A * | 5/2000 | Choi ..................... 365/185.02 |
| 6,108,238 A * | 8/2000 | Nakamura et al. ..... 365/185.17 |

OTHER PUBLICATIONS

Suh, Kang–Deog, et al. "A 3.3v 32Mb NAND Flash Memory with Incremental Step Pulse Programming Scheme" of IEEE journal of Solid–State Circuits vol. 30, No. 11 Nov. 1995, pp. 1149–1156.

* cited by examiner

*Primary Examiner*—Huan Hoang
(74) *Attorney, Agent, or Firm*—Marger Johnson & McCollom, P.C.

(57) ABSTRACT

Disclosed is a method for programming a non-volatile semiconductor memory device that avoids the program disturb problem. In the programming method, ground voltage is applied to a first bit line corresponding to a memory cell to be programmed, and power supply voltage is applied to a second bit line corresponding to a memory cell to be prevented from being programmed. Next, a program voltage is applied to a word line connected to the memory cell to be programmed. The program voltage is stepped up to a desired voltage level of each program cycle from the first voltage thereby to reduce coupling between selected and non-selected bit and word lines.

8 Claims, 7 Drawing Sheets

FLASH MEMORY DEVICE CAPABLE OF PREVENTING PROGRAM DISTURB AND METHOD FOR PROGRAMMING THE SAME

This application relies for priority upon Korean Patent Application No. 2000-069534, filed on Nov. 22, 2000, the contents of which are herein incorporated by reference in their entirety.

FIELD OF THE INVENTION

The present invention generally relates to non-volatile memory devices and more particularly to a method for programming a NAND-type flash memory device using a self-boosting technique.

BACKGROUND OF THE INVENTION

A flash memory device, known as a flash EEPROM (electrically erasable programmable read-only memory), typically includes an array of memory cells formed of floating gate transistors. The array includes strings (or, "NAND strings") of the floating gate transistors, and each of the floating gate transistors is connected between a string selection transistor and a ground selection transistor arranged in a series within each of the strings. A plurality of word lines are intersectionally arranged in the NAND strings, each being connected to a control gate of the floating gate transistors corresponding thereto.

Initially, the floating gate transistors, i.e., memory cells, are erased, for example, to have at a lower threshold voltage, e.g. −3V. To program a given memory cell, a high voltage (e.g., 20V) is applied to the word line of a selected memory cell for a predetermined time, so that the selected memory cell is changed to have higher threshold voltage. Meanwhile, threshold voltages of the unselected memory cells do not change.

There is a problem in programming the selected memory cell connected to a predetermined word line without programming the unselected memory cells connected to the same word line. When a program voltage is applied to the word line, the voltage is also applied to the unselected memory cells arranged along the same word line as well as the selected memory cell. Thus, the unselected memory cells connected to the word line, and in particular, the memory cell adjacent to the selected memory cell is programmed. Such unintentional programming of one or more unselected memory cells is called "program disturb".

A conventional method to prevent the program disturb problem is a program inhibition method employing a self-boosting scheme. The program inhibition method using the self-boosting scheme is disclosed in U.S. Pat. No. 5,677,873 entitled "Method of Programming Flash EEPROM Integrated Circuit Memory Devices To Prevent Inadvertent Programming of Nondesignated NAND Memory Cells Therein", and U.S. Pat. No. 5,991,202 entitled "Method for Reducing Program Disturb During Self-Boosting in a NAND Flash Memory", which are incorporated herein by these references.

In the program inhibition method using the self-boosting scheme, a ground path is blocked by applying 0V to the gate of a ground selection transistor. Zero V is applied to a selected bit line, while a power supply voltage Vcc of 3.3V or 5V is applied as a program inhibition voltage to an unselected bit line. At the same time, after the source of a string selection transistor is charged to Vcc-Vth (Vth: a threshold voltage of the string selection transistor) by applying the power supply voltage to the gate of the string selection transistor, the string selection transistor is virtually blocked. And then, a channel voltage of the program inhibited cell transistor is boosted by applying the program voltage Vpgm to the selected word line, and pass voltage Vpass to the unselected word lines. Thus, Fowler-Nordheim (F-N) tunneling cannot take place between the floating gate and the channel, thereby keeping the program inhibited cell transistor in the initial erased state.

Another conventional program inhibition method employs a local self-boosting scheme. The method is disclosed in U.S. Pat. No. 5,715,194 entitled "Bias Scheme of Program Inhibit for Random Programming In a NAND Flash Memory", and U. S. Pat. No. 6,061,270 entitled "Method for Programming a Non-volatile Memory Device with Program Disturb Control", which are incorporated herein by these references.

In the program inhibition method utilizing the local self-boosting scheme, 0V is applied to two unselected word lines adjacent to the selected word line. After the pass voltage Vpass (e.g., 10V) is applied to the other unselected word lines, the program voltage Vpgm is applied to the selected word line. According to the bias scheme, the channel of a self-boosted cell transistor is confined to the selected word line, and the channel boosting voltage of the program inhibited cell transistor is increased more than that of the foregoing method using the self-boosting scheme. Thus, the F-N tunneling cannot take place between the floating gate and the channel of the program inhibited cell transistor, thereby keeping the transistor in the initial erased state.

In the conventional program inhibition methods utilizing the self-boosting scheme or the local self-boosting scheme, however, the program disturb phenomenon increasingly occurs in accordance with an increasing density of the flash memory device. Intervals between adjacent signal lines are reduced due to the increasing integration density; thereby more easily generating couplings between the adjacent signal lines. For example, if a memory cell adjacent to the string selection transistor is programmed, the voltage on the string selection line (e.g., the power supply voltage) is boosted due to the capacitive coupling with the word line when the program voltage is applied to the selected word line. The rising voltage of the string selection line causes charges in the channel of the program inhibited cell transistor to go out to the unselected bit line through the string selection transistor being turned on by the rising voltage from the shut-off state, resulting in reducing the channel voltage of the program inhibited cell transistor. Consequently, the program disturb problem remains.

SUMMARY OF THE INVENTION

It is, therefore, an object of the present invention to provide a flash memory device capable of preventing a program inhibited memory cell from being soft-programmed during program operation, and a method for programming the device.

In order to attain the above object, according to an aspect of the present invention, there is provided a non-volatile memory device, having a plurality of memory cells arranged in matrix, a first and second selection transistors for selecting a memory cell, a plurality of bit lines connected to drains of the memory cells, and a plurality of word lines connected to control gates of the memory cells. In a method for programming the non-volatile memory device, a ground voltage is applied to a first bit line corresponding to the memory cell to be programmed, and a power supply voltage is applied to a second bit line corresponding to a memory cell to be prevented from being programmed. Then, a program voltage is applied to a first word line connected to the memory cell to be programmed. The program voltage is stepped up to a desired voltage level of each program cycle from the first voltage.

According to another aspect of this invention, there is provided a NAND-type flash memory device including a memory cell array, having a plurality of strings each of which is formed of a first selection transistor, a second selection transistor, and plural memory cells connected between the selection transistors in series, a plurality of bit lines connected to the plurality of strings corresponding thereto, and a plurality of word lines electrically connected to the memory cells of the strings, and a selection signal generating circuit creating a selection signal to select one of the word lines during a programming operation. The selection signal generating circuit creates the selection signal that is stepped up from ground voltage to a desired voltage of each program cycle.

The selection signal generating circuit includes: a switch pump receiving a program voltage having the desired voltage level of each program cycle and generating the program voltage in response to an oscillation signal provided from an oscillation circuit; a signal generator providing the selection signal having the output voltage from the switch pump; a counter performing a counting operation in the each program cycle in response to a clock signal; a decoder generating control signals which are sequentially activated by decoding the output of the counter; a voltage divider receiving the output voltage of the switch pump and generating a voltage dependent upon a resistance ratio controlled in accordance with an activating order of the control signals; and a comparator comparing the output voltage of the voltage divider with a reference voltage. The oscillation circuit generates the oscillation signal for the voltage provided from the switch pump to be increased in response to the output signal of the comparator, when the output voltage of the voltage divider is lower than the reference voltage.

According to the invention, the program voltage to be applied to the selected word line is stepped up for a predetermined rising time.

The foregoing features and advantages of the invention will be more fully described in the accompanying drawings.

BRIEF DESCRIPTION OF THE DRAWINGS

The above and other objects, features and advantages of the present invention will become more apparent from the following detailed description when taken in conjunction with the accompanying drawings in which.

DESCRIPTION OF THE PREFERRED EMBODIMENT

It should be understood that the description of the preferred embodiment is merely illustrative and that it should not be taken in a limiting sense. In the following detailed description, several specific details are set forth in order to provide a thorough understanding of the present invention. It will be appreciated, however, by one skilled in the art, that the present invention may be practiced without these specific details.

A flash memory device, employed in the present invention, utilizes an incremental step pulse programming method (ISPP) effectively to slow the rising edge of a programming voltage of a to-be-programmed memory cell. According to the programming method utilizing ISPP, program voltage Vpgm has a constant pulse width that is stepped up from a minimum voltage to a maximum voltage during a repeated program cycle. Such is disclosed in an article entitled "A 3.3V 32 Mb NAND Flash Memory with Incremental Step Pulse Programming Scheme" of IEEE Journal of Solid-State Circuits, vol. 30, No. 11, November 1995, pp 1149–1156 by Suh, Kang-Deog, et al., which is incorporated herein by reference.

Figure 1:
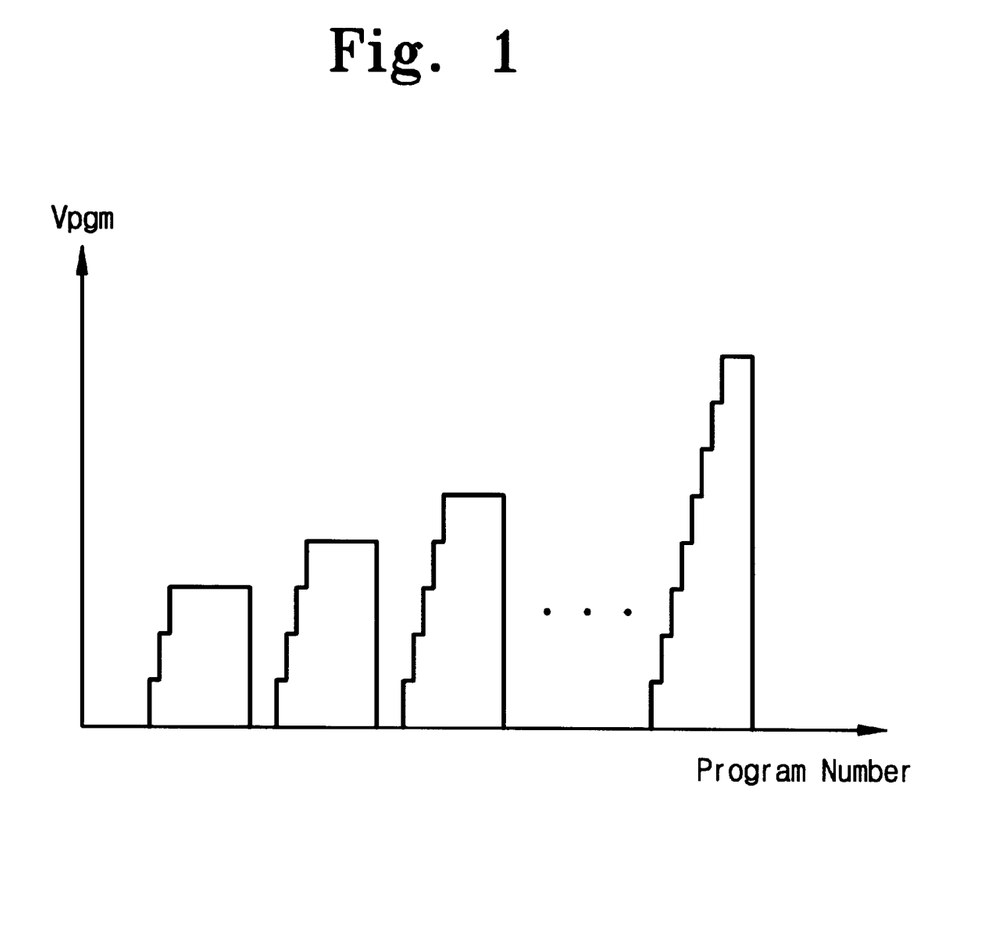
FIG. 1 is a graph showing variation of a program voltage employed in a programming operation according to a preferred embodiment of the present invention.

FIG. 1 shows the program voltage variation of the present invention. Referring to FIG. 1, the program voltage Vpgm is stepped up, not increased instantly (or suddenly), to a desired voltage of each program cycle from zero V. According to the step-up program voltage Vpgm, when the program voltage Vpgm is applied to a word line adjacent to a string selection line, the voltage of the string selection line can be prevented from being raised by capacitive coupling with the word line. That is, a boosting effect that might otherwise cause undesirable coupling between the string selection line and the word line can be substantially avoided or eliminated because the voltage*time product (i.e. the programming energy) remains relatively low.

Figure 2:
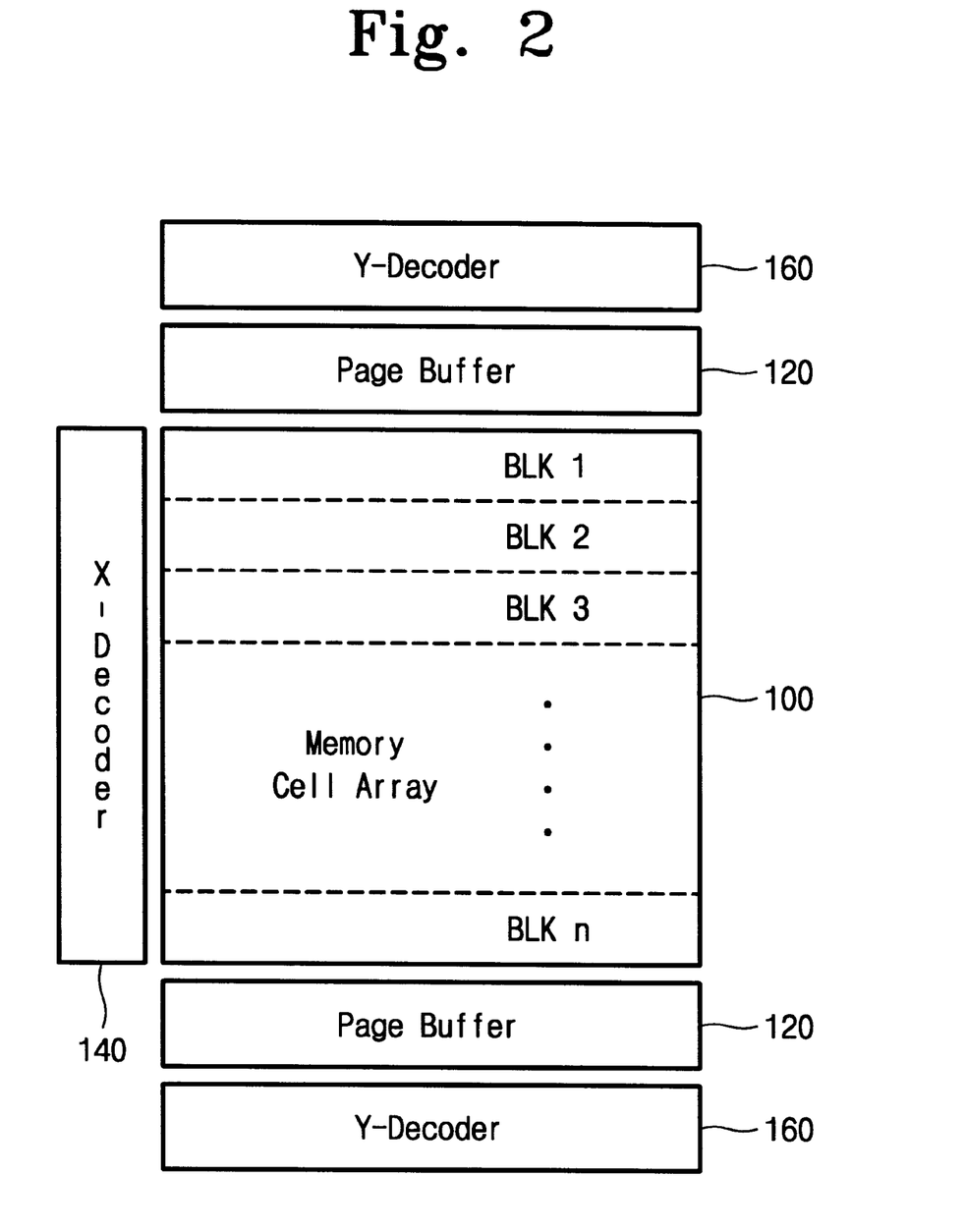
FIG. 2 is a block diagram showing a flash memory device according to the preferred embodiment of the present invention.
Figure 3:
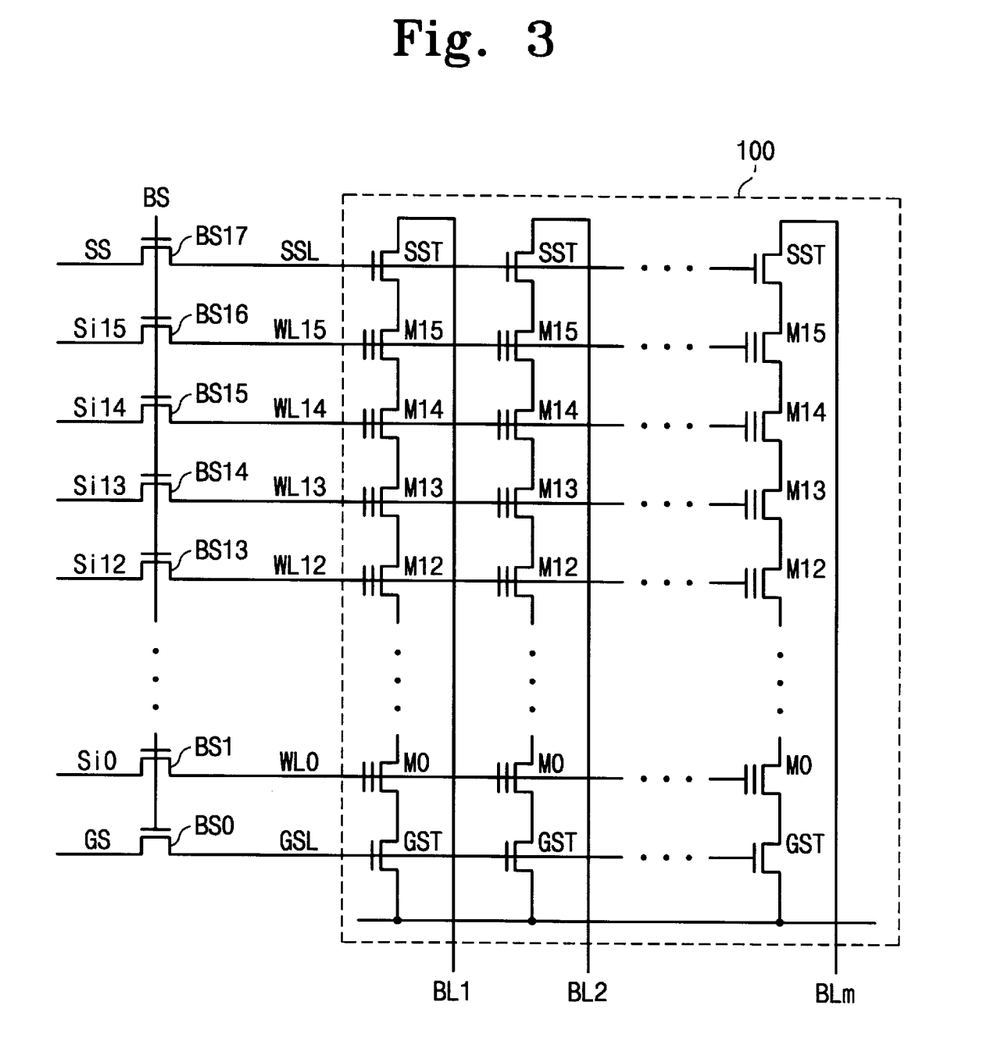
FIG. 3 is a circuit diagram showing a memory block shown in FIG. 2.

FIG. 2 is a block diagram schematically showing a construction of the flash memory device and FIG. 3 is a detailed circuit diagram of a typical memory block. Referring to FIGS. 2 and 3, the flash memory device includes an array divided into a plurality of memory blocks BLK1 through BLKn. In the flash memory device, plural bit lines are arranged in parallel through the memory blocks BLK~BLKn. A plurality of strings corresponding to the bit lines are provided in each of the memory blocks BLK1~bBLKn. Each of the strings provided to the memory blocks BLK~BLKn is formed of a string selection transistor SST, a ground selection transistor GST, and a plurality of flash EEPROM (electrically erasable and programmable read only memory) cell transistors (e.g., sixteen) M15~M0 connected between the source of the string selection transistor SST and the drain of the ground selection transistor GST in series, as shown in FIG. 3. A drain of the string selection transistor SST is connected to a corresponding bit line, and a source of the ground selection transistor GST is connected to a common source line CSL (or common signal line). Control gates of the flash EEPROM cell transistors M15~M0 in each string are commonly connected to corresponding ones of the word lines WL0~WL15. Each of the bit lines BL1~BLm is electrically connected to the page buffers 120 shown in FIG. 2.

The ground selection line GSL, the word lines WL0~WL15, and the string selection line SSL are respectively connected to selection signal lines GS, Si0~Si15, and SS through block selection transistors BS0~BS17 corresponding thereto. The block selection transistors BS0~BS17 are included in a row decoder circuit 140 shown in FIG. 2 (X-Decoder), and commonly connected to block selection control signal BS. The selection signal lines GS, Si0~Si15, and SS are activated to required voltages and by the corresponding selection circuits (or driving circuits) when a programming operation is performed. Here, the selected block selection control signal BS has a high-voltage level for the program voltage or pass voltage on the selection signal lines Si0~Si15 to be transferred to the corresponding word lines WL0~WL15 corresponding thereto.

Figure 4:
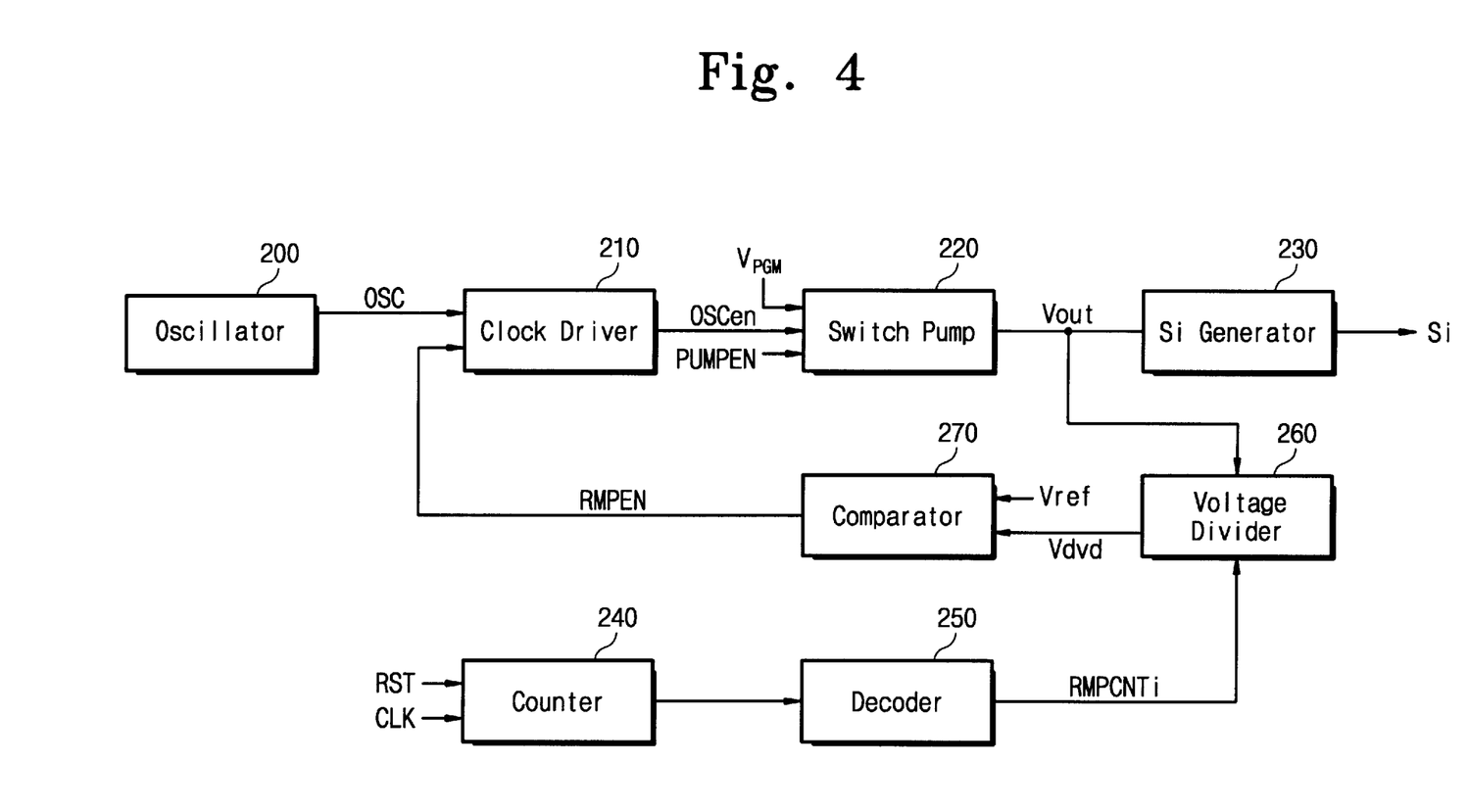
FIG. 4 is a block diagram showing a selection signal generator relative to a predetermined word line according to the preferred embodiment of the present invention.
Figure 5:
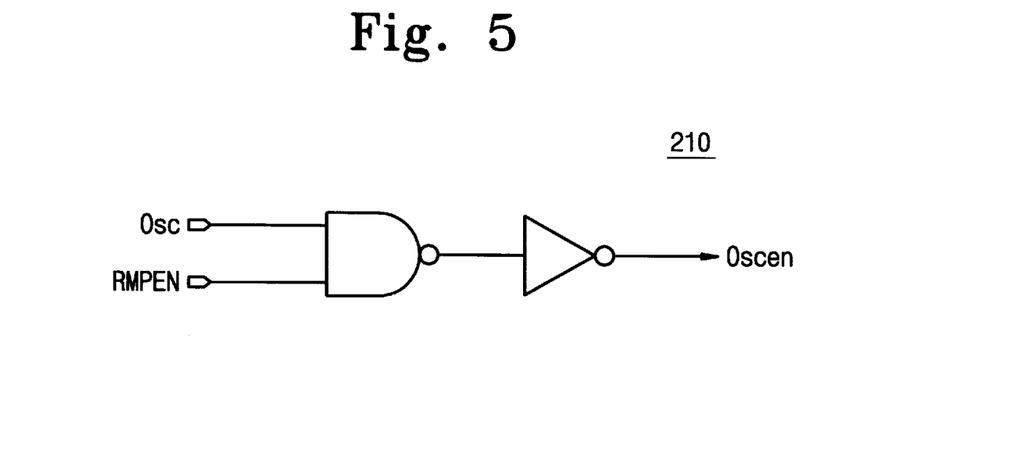
FIG. 5 is a circuit diagram showing a clock driver shown in FIG. 4.

A circuit which generates one of the selection signals Si0~Si15 being transferred to the word lines WL0~WL15 (referred to hereafter as "selection signal generating circuit") is shown in FIG. 4. Referring to FIG. 4, the selection signal generating circuit includes an oscillator 200, a clock driver 210, a switch pump 220, an Si generator 230, a counter 240, a decoder 250, a voltage divider 260, and a comparator 270. The clock driver 270 receives an output signal OSC of the oscillator 200, and is enabled or disabled in response to an output signal RMPEN from the comparator 270. When the clock driver 210 is disabled, an output signal OSCen is not transferred to the switch pump 220. The clock driver 210 is formed of a NAND gate and an inverter, as shown in FIG. 5. The switch pump 220 receives the program voltage Vpgm used in each program cycle, and provides voltage Vout that is stepped up to a desired voltage of each program cycle in response to the signals OSCen, and PUMPEN. The Si generator 230 provides a selection signal Si based the output voltage Vout provided from the switch pump 220.

Continuing to refer to FIG. 4, the counter 240 is an N-bit binary counter, and performs a counting operation in response to a clock signal CLK during each program cycle. The counter 240 is initialized by a reset pulse signal RST when each program cycle is started. The decoder 250 generates pulse-type control signals RMPCNTi which are sequentially activated by decoding the output signals of the counter 240. The voltage divider 260 receives the output voltage Vout of the swtich pump 220, and distributes the output voltage Vout depending on a predetermined resistance ratio, in response to the control signals RMPCNTi provided from the decoder 250.

Figure 6:
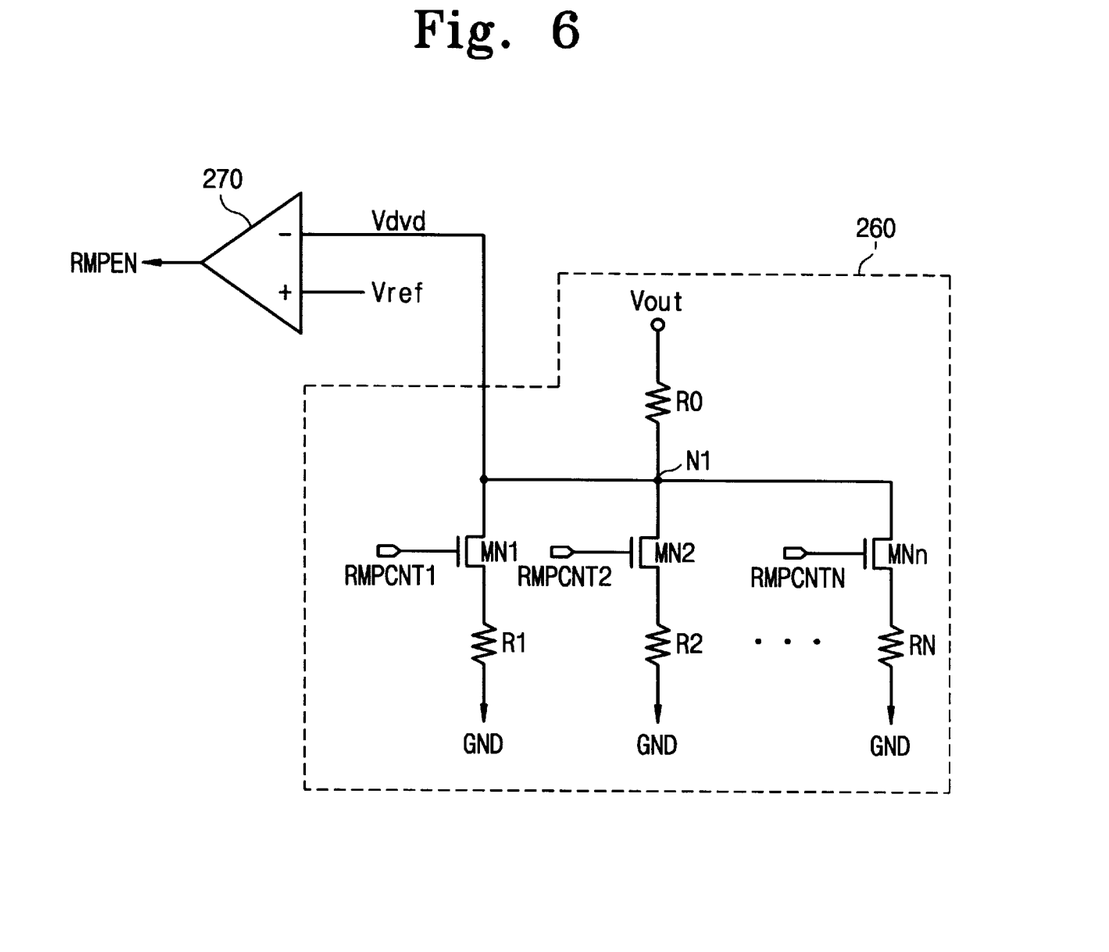
FIG. 6 is a circuit diagram showing a voltage divider shown in FIG. 4.
Figure 7:
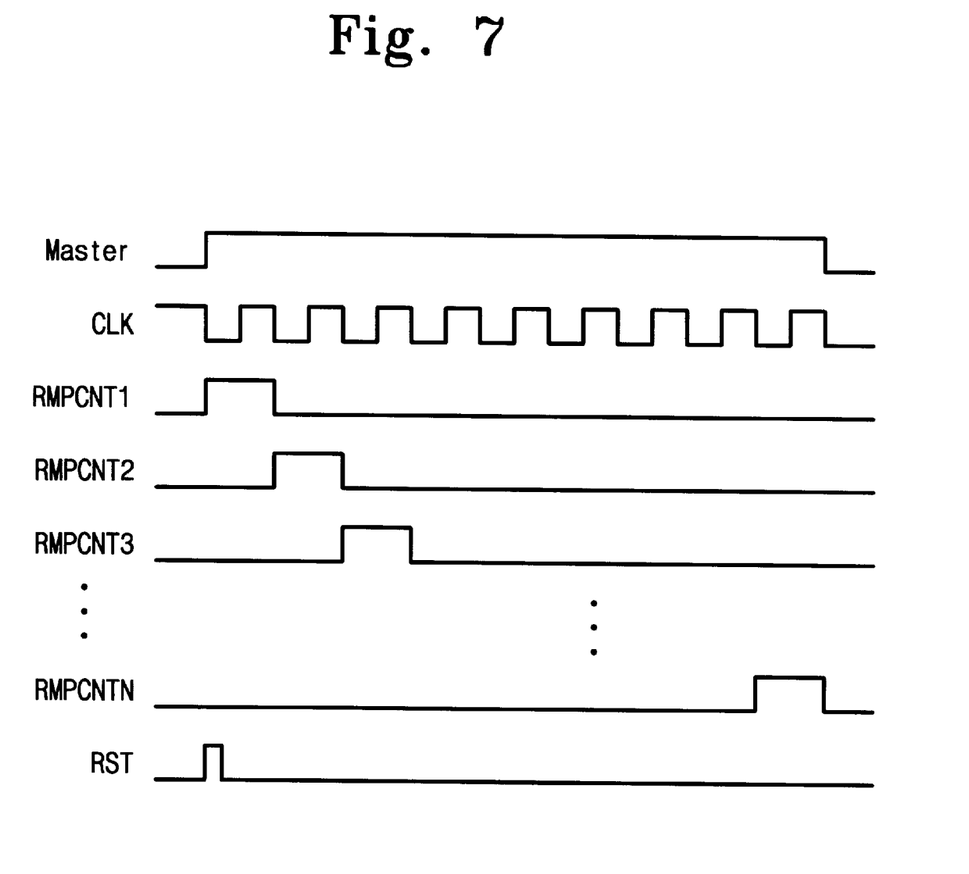
FIG. 7 is a timing diagram showing control signals employed in the selection signal generator shown in FIG. 4.

FIG. 6 shows the voltage divider 260 of the present invention. Referring to FIG. 6, the voltage divider 260 includes a plurality of resistors R0~Rn, and a plurality of NMOS (N-channel metal oxide semiconductor) transistors MN1~MNn. The resistor R0 is connected between the output voltage Vout of the switch pump 220 and a node N1 that serves as an output terminal for providing a distribution voltage Vdvd. The resistors R1~Rn respectively correspond to the NMOS transistors MN1~MNn. The resistors and NMOS transistors are connected between the output node N1 and the ground voltage GND in series. The NMOS transistors MN1~MNn are respectively controlled by the control signals RMPCNT1~RMPCNTn provided from the decoder 250. The values of the resistors R1~Rn vary from one another. Thus, the output voltage Vdvd of the voltage divider 260 is gradually increased in accordance with an activating order of the control signals RMPCNT1~RMPCNTn. The control signals RMPCNT1~RMPCNTn provided from the decoder 250 are sequentially activated for the NMOS transistors MN1~MNn to be sequentially turned on, as shown in FIG. 7.

Figure 8A:
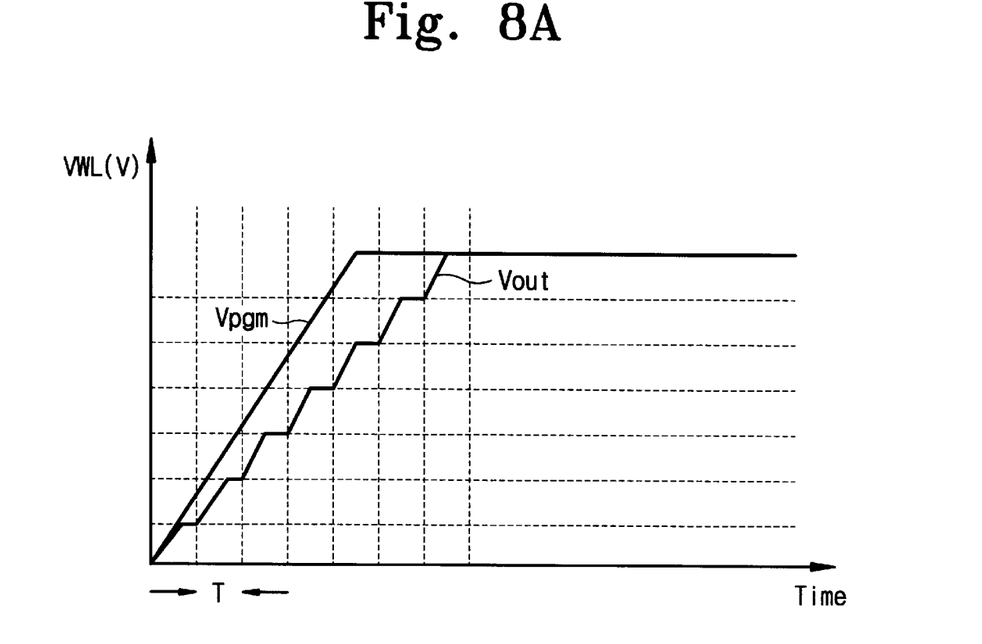
FIGS. 8A and 8B are graphs showing variations in the program voltage in response to output signals of a decoder shown in FIG. 4.
Figure 8B:
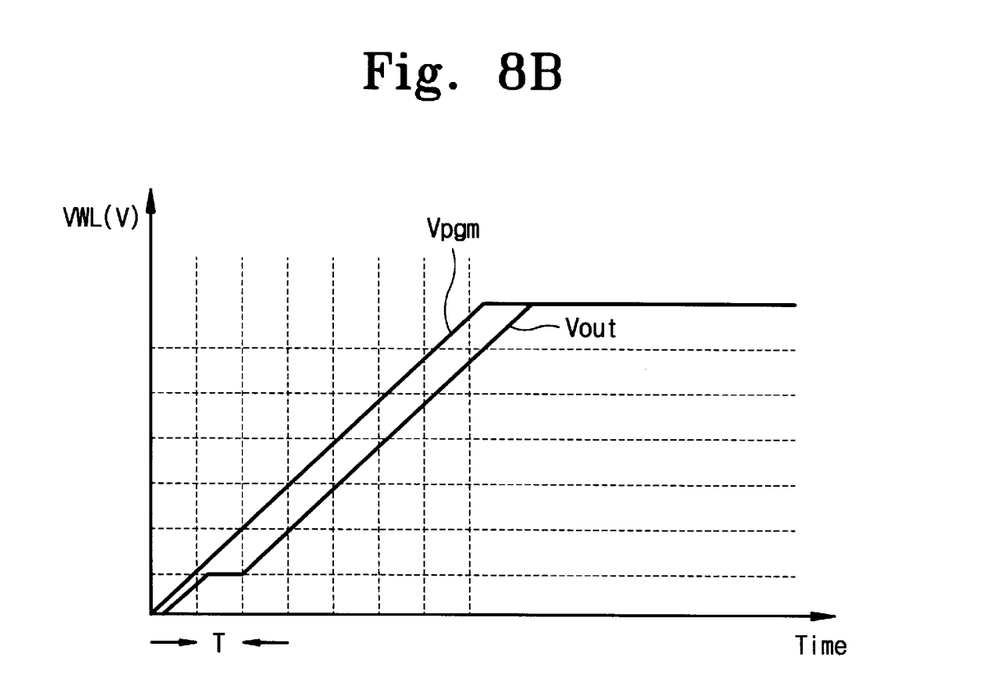

Referring again to FIG. 4, the comparator 270 compares reference voltage Vref having a predetermined level with the output voltage Vdvd of the voltage divider 260, and then provides the control signal RMPEN (to clock driver 210). When the voltage Vdvd is lower than the reference voltage Vref, the control signal RMPEN is activated. Thus, the input signal OSC of the clock driver 210 is transferred to the switch pump 220, and as a result the output voltage Vout of the switch pump 220 is stepped up, as shown in FIG. 8A. Meanwhile, if the voltage Vdvd is higher than the reference voltage Vref, the control signal RMPEN is inactivated. Thus, the output signal OSC of the clock driver 210 is not transferred to the switch pump 220. As a result, the operation of the switch pump 220 is stopped.

Thus, the voltage Vout provided from the switch pump 220, i.e. the program voltage to be applied to the selected word line, does not rise instantly but instead steps up to a desired voltage of each program cycle from 0V. Thus, in case the memory cell transistor M15 adjacent to the string selection transistor SST is programmed, when the step-up program voltage is applied to the selected word line WL15 any (undesirable) coupling between the string selection line SST and the selected word line WL15 is minimized. That is, the voltage of the string selection line SSL is scarcely increased when the word line voltage is applied to the selected word line. Consequently, when the programming operation employing the self-boosting, local self-boosting, or increment step pulse program schemes is performed, the boosted channel voltage of the program inhibited cell transistor is maintained effectively without leakage to the unselected bit line.

As described above, the program disturb problem can be avoided by the step-up program voltage to be applied to the selected word line for a predetermined step-wise rising time.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method for programming a non-volatile memory device having a plurality of memory cells arranged in matrix, a first and second selection transistors for selecting a memory cell, a plurality of bit lines connected to drains of the memory cells, and a plurality of word lines connected to control gates of the memory cells, the method comprising the steps of:

applying a first voltage to a first bit line corresponding to the memory cell to be programmed, and a second voltage to a second bit line corresponding to a program inhibited memory cell, and applying a program voltage to a first word line connected to the memory cell to be programmed, wherein the program voltage is stepped on the leading edge of each program cycle to a desired voltage level from the first voltage.

2. The method of claim 1, the method further comprising a step of applying a pass voltage to all of the word lines except for the first word line.

3. The method of claim 1, the method further comprising a step of applying the first voltage to a second word line adjacent to the first word line and the pass voltage to the other word lines except the first and second word lines.

4. The method of claim 1, wherein the first voltage is a ground voltage, and the second voltage is a power supply voltage.

5. A NAND-type flash memory device comprising:

a memory cell array having a plurality of strings each of which is formed of a first selection transistor, a second selection transistor, and plural memory cells connected between the selection transistors in series, a plurality of bit lines connected to the plurality of strings corresponding thereto, and a plurality of word lines electrically connected to the memory cells of the strings; and a selection signal generating circuit creating a selection signal that is stepped from ground voltage to a desired voltage of each program cycle, the selection signal selecting one of the word lines during a programming operation.

6. The device of claim 5, wherein the selection signal generating circuit comprises:

a switch pump receiving a program voltage having the desired voltage level of each program cycle and generating the stepped program voltage in response to an oscillation signal provided from an oscillation circuit;

a signal generator providing the selection signal having the output voltage from the switch pump;

a counter performing a counting operation in each program cycle in response to a clock signal;

a decoder generating control signals which are sequentially activated by decoding the output of the counter;

a voltage divider receiving the output voltage of the switch pump and generating a voltage dependent upon a resistance ratio controlled in accordance with an activating order of the control signals; and a comparator comparing the output voltage of the voltage divider with a reference voltage, wherein the oscillation circuit generates the oscillation signal provided to the switch pump to increase the voltage in response to the output signal of the comparator, the oscillation signal being generated only when the output voltage of the voltage divider is lower than the reference voltage.

7. A NAND-type flash memory device comprising:

a memory cell array having a plurality of strings each of which is formed of a first selection transistor, a second selection transistor, and plural memory cells connected between the selection transistors in series, a plurality of bit lines connected to the plurality of strings corresponding thereto, and a plurality of word lines electrically connected to the memory cells of the strings;

a selection signal generating circuit creating a selection signal that is stepped from ground voltage to a desired voltage of each program cycle, the selection signal selecting one of the word lines during a programming operation;

a switch pump receiving a program voltage having a desired voltage level of each program cycle and generating the stepped program voltage in response to an oscillation signal provided from an oscillation circuit;

a signal generator providing the selection signal having the output voltage from the switch pump;

a counter performing a counting operation in each program cycle in response to a clock signal;

a decoder generating control signals which are sequentially activated by decoding the output of the counter;

a voltage divider receiving the output voltage of the switch pump and generating a voltage dependent upon a resistance ratio controlled in accordance with an activating order of the control signals; and a comparator comparing the output voltage of the voltage divider with a reference voltage, wherein the oscillation circuit generates the oscillation signal for the voltage provided from the switch pump to be increased in response to the output signal of the comparator provided when the output voltage of the voltage divider is lower than the reference voltage.

8. The device of claim 7, wherein the control signals provided from the decoder are activated during a period corresponding to one cycle of the clock signal.

* * * * *